(12) United States Patent
Boulais et al.

(10) Patent No.: US 9,095,043 B2
(45) Date of Patent: Jul. 28, 2015

(54) ELECTROMAGNETIC CLOAK USING METAL LENS

(71) Applicant: The United States of America, as represented by the Secretary of the Navy, Washington, DC (US)

(72) Inventors: Kevin A. Boulais, La Plata, MD (US); Walter D. Sessions, King George, VA (US); Francisco Santiago, Fredericksburg, VA (US); Pearl Rayms-Keller, Fredericksburg, VA (US); Lucas R. Hale, King George, VA (US); Craig Andrew Calcagno, Fredericksburg, VA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 210 days.

(21) Appl. No.: 13/778,323

(22) Filed: Feb. 27, 2013

(65) Prior Publication Data

US 2014/0238734 A1    Aug. 28, 2014

(51) Int. Cl.
| | |
|---|---|
| *G01S 13/75* | (2006.01) |
| *H01Q 3/44* | (2006.01) |
| *H01Q 15/02* | (2006.01) |
| *H01Q 15/04* | (2006.01) |
| *H05K 9/00* | (2006.01) |

(52) U.S. Cl.
CPC .................. *H05K 9/00* (2013.01); *H01Q 15/04* (2013.01); *G01S 13/75* (2013.01); *H01Q 3/44* (2013.01); *H01Q 15/02* (2013.01)

(58) Field of Classification Search
CPC ............ H01Q 15/0086; H01Q 15/002; H01Q 15/0066; H01Q 17/00; H01Q 3/44; H01Q 15/0026; H01Q 15/0006; H01Q 15/0053; H01Q 15/02; H01Q 1/28; H01Q 1/32; H01Q 1/526; G02B 1/002; G02B 1/007; G02B 1/005
USPC ........................................................ 342/1–20
See application file for complete search history.

(56) References Cited

U.S. PATENT DOCUMENTS

| | | | |
|---|---|---|---|
| 6,791,432 B2 * | 9/2004 | Smith et al. ................... | 333/99 S |
| 7,405,866 B2 * | 7/2008 | Kuekes et al. ................ | 359/321 |
| 7,864,394 B1 * | 1/2011 | Rule et al. ..................... | 359/244 |
| 8,253,639 B2 * | 8/2012 | Cohen ........................... | 343/753 |
| 8,488,247 B2 * | 7/2013 | Cai et al. ....................... | 359/642 |
| 8,509,578 B2 | 8/2013 | Smolyaninov et al. ......... | 385/33 |
| 8,519,382 B2 | 8/2013 | Boulais et al. .................. | 257/40 |
| 8,674,792 B2 * | 3/2014 | Yonak et al. .................. | 333/205 |
| 8,803,637 B1 * | 8/2014 | Peralta et al. ................. | 333/219 |

(Continued)

OTHER PUBLICATIONS

"Bandwidth of Invisible Cloak Realized with Split Ring Resonators", Ivsic, B. ; Dept. of Wireless Commun., Univ. of Zagreb, Zagreb ; Sipus, Z. ; Bartolic, J., Microwave Techniques, 2008. COMITE 2008. 14th Conference on, Apr. 23-24, 2008, pp. 1-4.*

(Continued)

*Primary Examiner* — Peter Bythrow
(74) *Attorney, Agent, or Firm* — Gerhard W. Thielman, Esq.

(57) ABSTRACT

A cloak is provided for concealing an object to an electromagnetic field. A first vane encloses the object and a second vane encloses the first vane. The distance between the first and second vanes varies relative to the object, so as to conceal the object to the electromagnetic field.

14 Claims, 3 Drawing Sheets

(56) References Cited

U.S. PATENT DOCUMENTS

| | | | |
|---|---|---|---|
| 2007/0114431 A1* | 5/2007 | Wang et al. | 250/370.14 |
| 2007/0188385 A1* | 8/2007 | Hyde et al. | 343/700 MS |
| 2008/0024792 A1* | 1/2008 | Pendry et al. | 356/602 |
| 2008/0165442 A1* | 7/2008 | Cai et al. | 359/896 |
| 2009/0273538 A1* | 11/2009 | Smith et al. | 343/909 |
| 2010/0053763 A1* | 3/2010 | Chowdhury et al. | 359/652 |
| 2010/0086272 A1* | 4/2010 | Li et al. | 385/129 |
| 2010/0110559 A1* | 5/2010 | Cai et al. | 359/642 |
| 2011/0069377 A1* | 3/2011 | Wu et al. | 359/356 |
| 2011/0085229 A1* | 4/2011 | Lavrentovich et al. | 359/315 |
| 2011/0102098 A1* | 5/2011 | Venermo et al. | 333/33 |
| 2011/0141541 A1* | 6/2011 | Bratkovski | 359/240 |
| 2011/0171374 A1* | 7/2011 | Smolyaninov et al. | 427/160 |
| 2011/0209110 A1* | 8/2011 | Grbic et al. | 716/110 |
| 2012/0019892 A1* | 1/2012 | Bowers et al. | 359/276 |
| 2013/0017348 A1* | 1/2013 | Sanada | 428/34.1 |

OTHER PUBLICATIONS

W. E. Kock, "Metal-Lens Antennas", Proc. IRE Waves and Electrons 34, 11 (1946).

H. Hashemi et al., "Delay-bandwidth and delay-loss limitations for cloaking of large objects", *Phys. Rev Lett.* 104, 253903 (2010) http://math.mit.edu/~stevenj/papers/HashemiZh10.pdf.

S. A. Cummer et al., "Full-wave simulations of electromagnetic cloaking structures", *Phys. Rev. E* 74, 036621 (2006) http://arxiv.org/pdf/physics/0607242v1.pdf.

K. A. Boulais et al., "Tunable split-ring resonator for metamaterials using photocapacitance of semi-insulating GaAs", *Appl. Phys. Lett.* 93, 043518 (2008) http://scitation.aip.org/content/aip/journal/apl/93/4/10.1063/1.2967192.

A. Alu et al., "Achieving Transparency with Metamaterial and Plasmonic Coatings", *Phys. Rev. E* 72, 1 (2005) http://repository.upenn.edu/cgi/viewcontent.cgi?article=1175&context=ese_papers.

I. Smolyaninov et al., "Anisotropic Metamaterials Emulated by Tapered Waveguides . . . ", *Phys. Rev. Lett.* 102, 213901 (2009) http://prl.aps.org/pdf/PRL/v102/i21/e213901.

J. B. Pendry et al. "Controlling Electromagnetic Fields." *Science*, 312 (1780), 2006. http://www.ccc.utah.edu/~dschurig/Site/Top_Cited_Publications_files/1780.pdf.

U. Leonhardt, "Optical Conformal Mapping", *Science*, 312 (23), 2006. http://arxiv.org/pdf/physics/0602092v1.pdf.

P. Alitalo et al., "Experimental verification of broadband cloaking using a volumetric cloak composed of periodically stacked cylindrical transmission-line networks", *Appl. Phys. Lett.*, 94 (014103), 2009. http://lib.tkk.fi/Diss/2009/isbn9789512299874/article8.pdf.

D. Schurig et al., "Metamaterial Electromagnetic Cloak at Microwave Frequencies", *Science*, 314 (10), 2006. http://www.ccc.utah.edu/~dschurig/Site/Top_Cited_Publications_files/977.pdf.

P.-S. Kildal et al, in "Reduction of Forward Scattering from Cylindrical Objects using Hard Surfaces", *IEEE Trans. Antennas Propagation*, 44 (11), 1996.

M.-L. Wu et al., "Completely Adiabatic S-Shaped Bent Tapers in Optical Waveguides", *IEEE Photonics Tech. Lett.*, 9(2), 1997.

\* cited by examiner

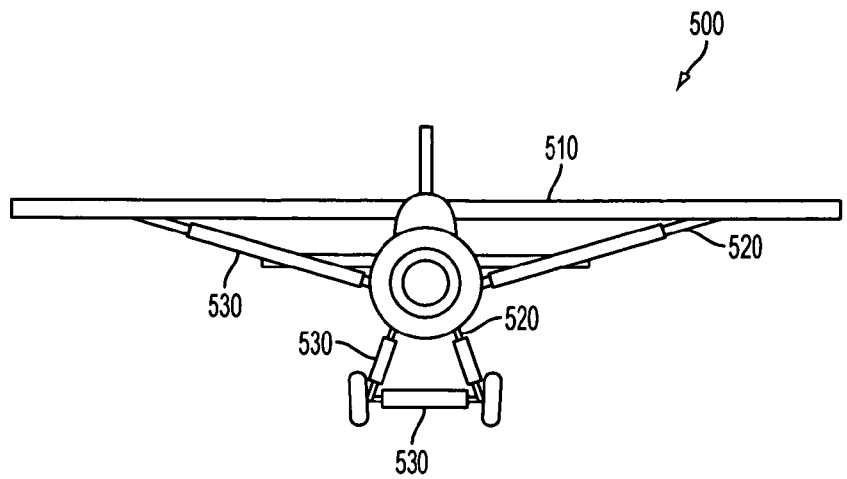
FIG. 5
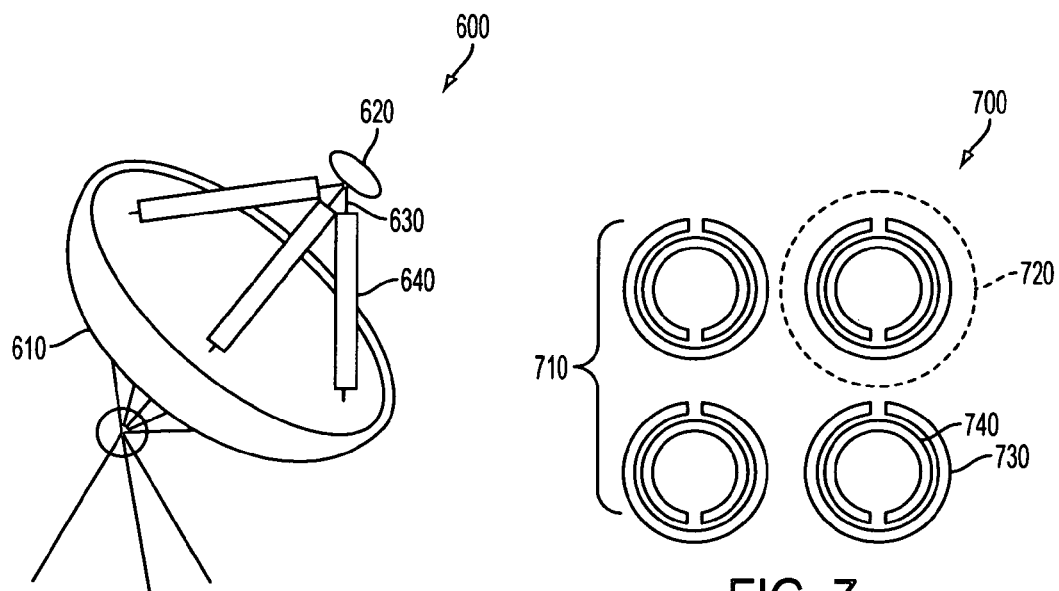
FIG. 6
FIG. 7

ELECTROMAGNETIC CLOAK USING METAL LENS

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to relates to an apparatus to cloak objects large and small from electromagnetic radiation. In particular, the invention relates to an electromagnetic cloak having plates adjacently disposed at a separation distance.

Due to the ever increasing use of electromagnetics, the United States armed forces need methods to prevent electromagnetic interference. Preventing electromagnetic interference is also useful in the private sector. The physical implementation of an electromagnetic cloak is a relatively new idea, although the basic physics of electromagnetism has been long known. An electromagnetic cloak can conceal an interior object to electromagnetic radiation by not disturbing the electromagnetic field outside of the cloak in a detectable way. Such a cloak can be used anywhere there is an object that interacts with an electromagnetic wave.

In order to cloak an object, radiation must travel around the object and reconstruct on the other side in both phase and amplitude. The path around an object, embedded in free space, for example, is longer than the path radiation would take in free space if the object were not there. Free space radiation travels at the speed of light, and so the velocity of the wave taking the longer path must travel faster than the speed of light so the phase can reconstruct on the other side. The wave velocity denoted constitutes the phase velocity, which can travel faster than the speed of light without violating physical laws because there is no energy moved by phase velocity.

In a true cloak, the radiation is generalized to any polarization and frequency, and can originate from any origin. Scattered waves are non-existent and transmitted waves are not distorted in either phase or amplitude outside the cloak. The cloak behavior would not depend on the electromagnetic nature of the object being cloaked. There exists no known physically realizable cloak that can accommodate all these generalizations simultaneously. Therefore, a need exists for an effective electromagnetic cloak that can prevent electromagnetic interference.

SUMMARY

Conventional shielding techniques yield disadvantages addressed by various exemplary embodiments of the present invention. In particular, various exemplary embodiments provide, a cloaking system for use in an electromagnetic field includes a shielded element; a first plate enclosing the shielded element; and a second plate enclosing the first plate. The first plate and second plate are separated by a distance that varies by a distance depending on design optimizations. The first and second plates together create a first vane. Exemplary embodiments provide, the shielded element comprises a portion of one of a wind turbine, an airplane and an antenna.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which:

FIG. 5 represents cloaks placed on the struts of an airplane;

FIG. 6 shows cloaks placed on the struts of a dish antenna; and

FIG. 7 illustrates a metal lens cloak.

DETAILED DESCRIPTION

Figure 1:
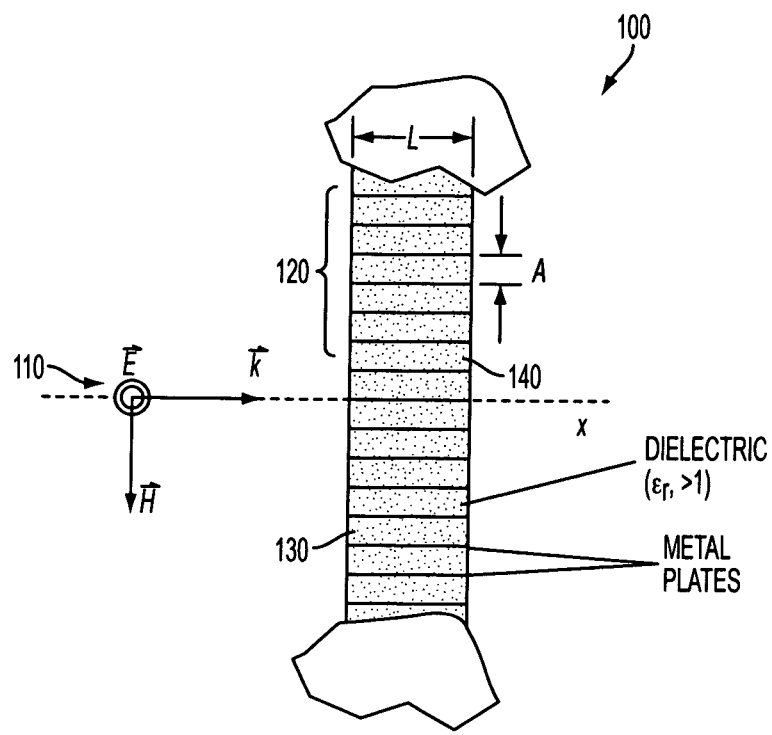
FIG. 1 is a diagram view of an electromagnetic wave guide using short parallel plates.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

There has been recent and dramatic interest in the concept of an electromagnetic cloak. The cloak can conceal an object to electromagnetic radiation by not disturbing the radiation outside the cloaking shell. In a true cloak, the radiation can have any polarization and frequency, and can originate from any origin. Scattered waves are non-existent and transmitted waves are not distorted. There exist no known cloaks that can accommodate all these generalizations simultaneously that are physically realizable. Typically, a cloak is fabricated with particular restrictions placed on the electromagnetic radiation such as polarization, propagation direction (dimensionality), and/or use for a single frequency.

Several concepts have been proposed or demonstrated to establish cloaking. In 2005, A. Alu and N. Engheta, "Achieving transparency with plasmonic and metamaterial coatings", *Phys. Rev. E,* 72 (016623) (available at http://repository.upenn.edu/cgi/viewcontent.cgi?article=1175&context=ese_papers) proposed plasmonics to achieve transparency. Their work was based on principles of scattering and interference. In 2006, electromagnetic cloak designs were proposed by J. B. Pendry et al. "Controlling Electromagnetic Fields," *Science,* 312 (1780) (http://www.ece.utah.edu/~dschurig/Site/Top_Cited_Publications_files/1780.pdf), and U. Leonhardt, "Optical Conformal Mapping", *Science,* 312 (23) (preprint at http://arxiv.org/pdf/physics/0602092v1.pdf). These latter solutions depend on spatially variant and anisotropic requirements of the index-of-refraction to bend the wave around an object. The method necessitates the flexibility intrinsic to metamaterials for fabrication. P. Alitalo et al. demonstrated a volumetric broadband cloak that used principles of waveguides "Experimental verification of broadband cloaking using a volumetric cloak composed of periodically stacked cylindrical transmission-line networks", *Appl. Phys. Lett.,* 94 (014103) available at (http://lib.tkk.fi/Diss/2099/isbn9789512299874/article8.pdf), although that method is limited to small cloaked objects that fit between the guides near the center of the cloak.

The first experimental demonstration of a cylindrically symmetric cloak utilized a graded and anisotropic index-of-refraction as reported by D. Schurig et al., "Metamaterial Electromagnetic Cloak at Microwave Frequencies", *Science*, 314 (10) (http://www.ccc.utah.edu/~dschurig/Site/Top_Cited_Publications_files/977.pdf) at a frequency of 8.5 GHz. As with most cylindrically symmetric designs, the cloak behavior was restricted to rays that did not have an axial component. Further, in 2006, the polarization was fixed that simplified design in S. A. Cummer et al. "Full-wave simulations of electromagnetic cloaking structures", *Phys. Rev. E*, 74 (036621), (http://people.engr.ncsu.edu/dschuri/Site/Publications_files/PhysRevE_74_036621.pdf). Often, applications do not require a true cloak solution.

Exemplary embodiments describe a cloak with restrictions that the radiation is a plane wave with a known direction, polarization and frequency. When the electromagnetic wave is of known origin, the demand for symmetry is reduced. An application might be to cloak the tall platforms of a windmill farm that interfere with a known transmitter. The disclosure herein extends to cloaks embedded in materials other than free space, and those that have a dielectric strength different than one. Such methods have been used for purposes other than cloaks as discussed by P.-S. Kildal et al. in "Reduction of Forward Scattering from Cylindrical Objects using Hard Surfaces", *IEEE Trans. Antennas Propagation*, 44 (11), 1996. Various exemplary embodiments are based on a metal lens model first introduced in 1946 by W. E. Kock in "Metal-Lens Antennas", *Proc. of the I.R.E. and Waves and Electrons*, 34 (11) 828-836. Conformal mapping techniques can be used to design bent tapered waveguides, as demonstrated in 1997 by M.-L. Wu et al., "Completely Adiabatic S-Shaped Bent Tapers in Optical Waveguides", *IEEE Photonics Tech. Lett.*, 9 (2).

Kock demonstrated a lens effect applicable to antennas by controlling the phase velocity through parallel plate waveguides embedded in free space or air (with relative dielectric constant equivalent to unity) according to eqn. (1) below:

$$v_p = \frac{c}{n} = \frac{c}{\sqrt{1-\left(\frac{\lambda}{2a}\right)^2}} \quad (1)$$

where c is the speed of light, n is the index of refraction of the material, $\lambda$ is the electromagnetic wavelength, and a is the spacing between the plates. For the phase velocity to travel faster than the speed of light, the effective index of refraction must be less than unity. Equations for other types of waveguides are similar, with adjustments for media with a non-unity dielectric constant. In particular, the effective index of refraction is less than one for all spacing distances greater than the half-wavelength, or a>$\lambda$/2, which is a requirement for a cloak. Thus, the concept of the metal lens can be used to cloak objects to radiation of known frequency and origin.

Kock demonstrated lensing by controlling the phase propagation time through parallel plate waveguides given (as modified from the Appendix) by:

$$\tau_p = \frac{L}{v_{WG}} = \frac{nL}{c} = \frac{L}{c}\sqrt{1-\left(\frac{\lambda}{2a}\right)^2}, \quad (2)$$

where L is the physical path length of the guide, n is the effective index-of-refraction, c is the phase velocity in free space, $\lambda$ is the wavelength of the radiation, and a again is the plate separation. The lens designs consist of simple geometrical principles based on either path length L or else plate separation a.

The concept of the metal lens can be used to cloak objects to radiation of known polarization, frequency and origin. Decreased phase propagation time, necessary for phase reconstruction at the output, is controlled by plate length and separation according to eqn. (2). Anisotropic behavior of the metamaterial cloak, necessary to bend a ray around an object, is mimicked by the guides.

FIG. 1 shows a cross-section view 100 of an electromagnetic waveguide in a one-dimensional configuration from Kildal et al. that serves as a non-interfering structural support. An electromagnetic wave 110 indicates propagation vector $\vec{k}$ (horizontal right), magnetic field $\vec{H}$ (vertical down) and electric field $\vec{E}$ (normal out of the page). The waveguide is shown as a slab 120 of stacked layers constructed from dielectric material 130 sandwiched between metal plates 140, with a spacing distance A and a length L so as to effectively "conceal" itself by enabling electromagnetic radiation (of the appropriate frequency) to pass therethrough without interference. Such plates 140 can be composed of steel, aluminum or other structurally appropriate material, and can be further coated with an electrically conductive material such as copper, silver and gold. Other materials, such as carbon fiber and polymers can be considered depending on specific need.

Figure 2:
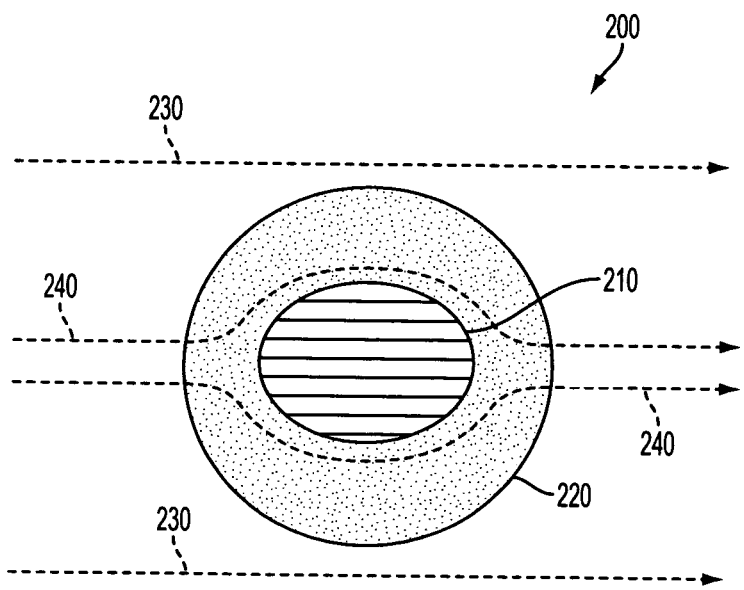
FIG. 2 is a diagram view of deflection paths of electromagnetic waves outside an electromagnetic cloak.

FIG. 2 shows a cross-section view 200 of an object 210 concealed by a metamaterial cloak 220. Electromagnetic waves travel unimpeded along an external path 230 outside of the cloak 220. By contrast, anisotropic gradients in the index-of-refraction guide electromagnetic waves along an internal path 240 through the cloak 220 around the object 210. The paths 230 and 240 correspond in direction to the propagation vector $\vec{k}$ shown in FIG. 1 for the electromagnetic wave 110. These waves along the internal path 240 must travel faster through the cloak 220 than the waves along the external path 230. Otherwise, trailing-edge mismatch compromises concealment. This is due to the path 240 through the cloak 220 around the object 210 being longer than the path 230 around the cloak 220.

Figure 3:
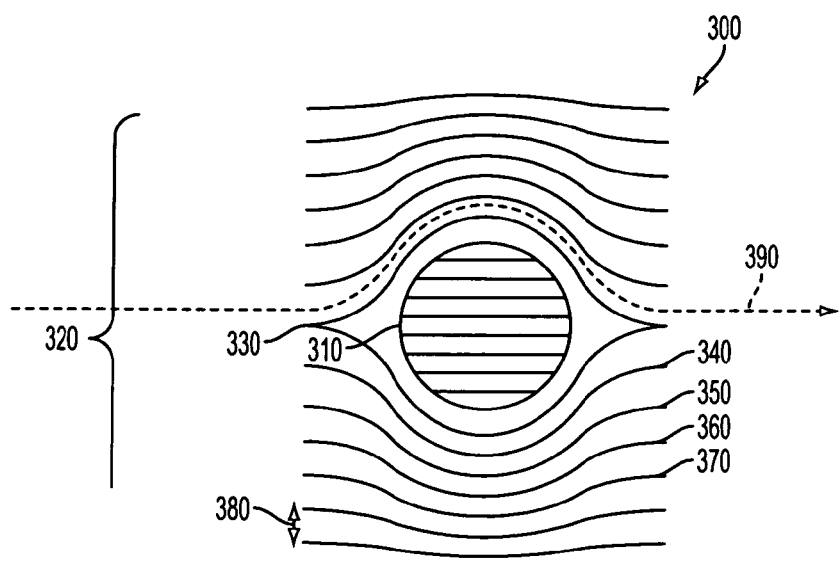
FIG. 3 is a cloak of metal lens plates around an object in the center.

FIG. 3 shows a planar cross-section view 300 of a cylinder 310 enveloped and cloaked by a streamline guide 320 formed by successively expanding curve metal plates 330, 340, 350, 360 and 370, separated by a spacing distance 380 that form waveguide paths. An electromagnetic wave 390 (denoted by a dash line) travels between plates 330 and 340, without interception by the cylinder 310. The wave 390 travels in direction corresponding to the propagation vector $\vec{k}$ shown in FIG. 1 for the electromagnetic wave 110. The plates of the guide 320 nearest the cylinder 310 can have its same radius. The vanes successively expand outward from the cylinder 310 with expanding radii of curvature of the plates. This has the effect of flattening the outermost guide plates reducing scatter of an incoming plane wave. An observer cannot detect the guide 320 from either fore or aft because phase and amplitude are restored.

As a wave traverses the innermost vane, for example, the consequential narrowing of the path between the plates increases the phase velocity sufficiently to account for the longer path length required to traverse around the cylinder 310. Plate geometries are adjusted so that the electrical length of each guide is the same as if the guide 320 and cylinder 310 were absent. Note that unlike Kock's metal lens, the plate separation a varies as the wave propagates through the guide. The plate separation distance 380 can be designed to accommodate large size or uniquely shaped objects rather than a cylinder with uniform radius.

For various design solutions as an example of a metal lens cloak, the effective electrical length of each vane (between vanes plates) is guided to conform to that of the external free space path. In addition, the electrical length is designed so that destructive interference at the input results in a perfect impedance match. For example, the plate in the cloak can optionally be composed of four identical segments of equal radius and circumference. The constant radius guarantees no sharp bends and provides for a smooth propagation path for the electromagnetic radiation to pass. This design naturally opens the vanes structure at the input and output, which aids in matching the guide impedance at the input and output, serves to flatten the vanes further away from the origin and provides for a smooth impedance transition to the narrowest part of the vane (where impedance is the highest) much in the same manner that back-to-back horn antennae would.

The combined physical path length of all four segments of any vane designed this way, represented by the dash line electromagnetic wave path 390, can be determined by ray tracing through the geometry resulting in the relation:

$$s_{WG} = 4\left(r_i + \frac{a_i}{2}\right)\sin^{-1}\left(\frac{\sqrt{r_o(3r_o + 2a_o)}}{2\left(r_i + \frac{a_i}{2}\right)}\right), \quad (3)$$

where $r_o$ and $r_i$ are the inner radius of the $0^{th}$ and subsequent plates 330, ... 370, respectively, and $a_o$ and $a_i$ are the plate separations 380 of the $0^{th}$ and subsequent plates, respectively. In principle, such analysis can be extended, albeit with greater complexity, to tapering structures with outer radii that vary along the structure's axial length. Similarly, FIG. 3 can be used to find the physical path length of free space as:

$$s_{FS} = 2\sqrt{r_o(3r_o + 2a_o)}. \quad (4)$$

Geometry can be used to calculate the physical path length $s_{WG}$, of a guide (a) of the $0^{th}$ order guide and (b) subsequent guides. Each guide has a constant width. The total time $\tau_{WG}$ for the wave to traverse the guide is $$\tau_{WG} = s_{WG}/v_{WG}, \quad (5)$$

where $v_{WG}$ is velocity of the waveguide. In free space (and absent of the guide) can and to traverse free space in the absence of the guide, the velocity is the speed of light such that:

$$\tau_{FS} = s_{FS}/c. \quad (6)$$

In order for the phase to match at the output of the guide, the time difference is set to zero such that:

$$\Delta\tau = 4\left(r_i + \frac{a_i}{2}\right)\sqrt{1 - \left(\frac{\lambda}{2a_i}\right)^2} \sin^{-1}\left(\frac{\sqrt{r_o(3r_o + 2a_o)}}{2\left(r_i + \frac{a_i}{2}\right)}\right) - \\ 2\sqrt{r_o(3r_o + 2a_o)} = 0, \quad (7)$$

where $a_o$ is found by setting i=0 in eqn. (7) and solving the transcendental equation. Each subsequent $a_i$ and $r_{i+1}$ are then determined sequentially in a similar manner.

An example solution of eqn. (7) can be provided for λ=3 cm and $r_o$=0.5 m, where the furthest plate has been limited to a constant radius of 1 m. For $r_i$>>$a_i$, the plate separation converges to:

$$a_i \cong \frac{\lambda}{2\sqrt{1 - \left(\frac{\sqrt{3}\,r_o}{2r_i\sin^{-1}(\sqrt{3}\,r_o/2r_i)}\right)^2}}, \quad (8)$$

which is shown as dash line for electromagnetic wave path 390. Note that in this approximation, $a_o \cong 0.889\lambda$. The plate separation 380, i.e., spacing a of eqn. (8), is varied as the electromagnetic wave 390 propagates through the cloak 320 being thinnest at near the cylinder 310 and thickening as a function progressing further away. The reflection coefficient Γ at the input of each guide is approximately $$\Gamma = \frac{\eta_{WG} - \eta_{FS}}{\eta_{WG} + \eta_{FS}}, \quad (9)$$

where the guide impedance is:

$$\eta_{WG} = \eta_o/\sqrt{1 - (\lambda/2a)^2}. \quad (10)$$

and the free space impedance is:

$$\eta_{FS} = \eta_o. \quad (11)$$

In the above example, the worst case reflection coefficient is for the innermost guide at Γ=9.2%, and the best case is for the outermost guide at Γ=2.0%. The reflection coefficient can be improved using by several methods. For example, one can include an impedance transformer by flaring the input and output sections, which also eliminates the space between the guides 320, as long as overall phase is accounted for. Also, the physical and electrical lengths of the guides can be fabricated to so that any reflected wave from the guide output will cancel reflected waves at the guide input.

The cloak assembly (denoting cloak and object concealed thereby) can operate within an electromagnetic field without producing a detectable disturbance beyond the cloak assembly. Thus, both phase and amplitude of the electromagnetic wave must be restored everywhere outside of the cloak to initial characteristics before the immersion of the cloak assembly. Many uses can be made from this concept. For example, signal noise from a large windmill farm with an airport radar system can be improved by cloaking each windmill stand, thereby enabling the emitted and return radar signals to pass through either direction as if the windmill stand were absent. The metal lens cloak of these embodiments accomplishes the cloaking behavior using metal lens techniques.

There has been recent and dramatic interest in the concept of an electromagnetic cloak. A cloak can conceal an object to electromagnetic radiation by not disturbing the radiation outside the cloaking shell. In a true cloak, the radiation is generalized to any polarization and frequency, and can originate from any origin. Scattered waves would be non-existent and transmitted waves are not distorted in either phase or amplitude outside the cloak. The cloak behavior would not depend on the electromagnetic nature of the object being cloaked. There exist no known cloaks that can accommodate all these generalizations simultaneously. Typically, a cloak is fabricated with particular restrictions placed on the electromagnetic radiation such as polarization, propagation direction (dimensionality), and/or use for a single frequency.

Conventionally, two approaches to cloaking have been pursued prior to the exemplary embodiments. The first approach is based on the principles of scattering (often referred to as plasmonic approaches), as described by Alu. A drawback of this approach seems to be that higher order scattering modes are difficult to suppress for large cloaks. Thus the mantle cloak seems to be restricted to cloaking objects no larger than a few wavelengths.

The second approach is based on principles of metamaterials, which are synthetic materials that can mimic the electric and/or magnetic polarization of natural materials, but in an engineered and controlled way as provided by Schurig, whose metamaterial approach utilized a difficult transformation to design the cloak called transformation optics. The design resulted in a recipe based on effective constituent parameters for the dielectric constant and permeability required by the metamaterial. The square root of the multiplication of these parameters gives an effective index of refraction that varies throughout the material and can be made less than unity.

A further complication is that the variation in index of refraction is typically anisotropic in this approach, meaning the parameters are different along each coordinate. These complications make the metamaterial cloak difficult to fabricate. Still further complications exist in trying to design the localized cells in the structure to result in the desired effective parameters, and it often takes several iterative design processes between the cell structure modeling, desired constituent parameters modeling, and the experimental trials. Another disadvantage of this design is due to the high dispersive losses typical of metamaterials. Thus, metamaterial cloaks based on cylindrical designs seem to be restricted to sizes on the order of a few wavelengths at most.

These embodiments are extendable to cloaks embedded in materials other than free space, and those that have a dielectric strength different than one. Consider a lossless dielectric slab with a relative permittivity $\in_r > 1$ and of finite thickness L in the x-dimension, but otherwise infinite in extent. For a plane wave with normal incidence and known frequency, the thickness of the slab can be adjusted to extinguish the reflection coefficient in ways known to those skilled in the art of microwave engineering. Although this results in a unity transmission coefficient, the phase delay does not vanish.

As described for FIG. 1, the configuration of many parallel plates 140 embedded within the slab 120. The plates 140 have a period corresponding to plate separation A, with electromagnetic polarization assumed. The plates 140 form an effective index-of-refraction between zero and unity, thereby increasing phase velocity through the slab 120. The phase delay through the slab 120 vanishes if the plate separation A is:

$$A = \frac{\lambda}{2\sqrt{1 - 1/\varepsilon_r}} \quad (12)$$

where $\lambda$ is the radiation wavelength, and $\in_r$ is the relative permittivity of the dielectric. Thus, a concept has been defined in which an observer in the far field cannot detect if the slab 120 (with plates 140) is present. Phase and amplitude are completely restored. In addition, the reflection of a plane wave from the entrance of the cloak can be extinguished using destructive interference similar to the Salisbury screen approach.

Figure 4:
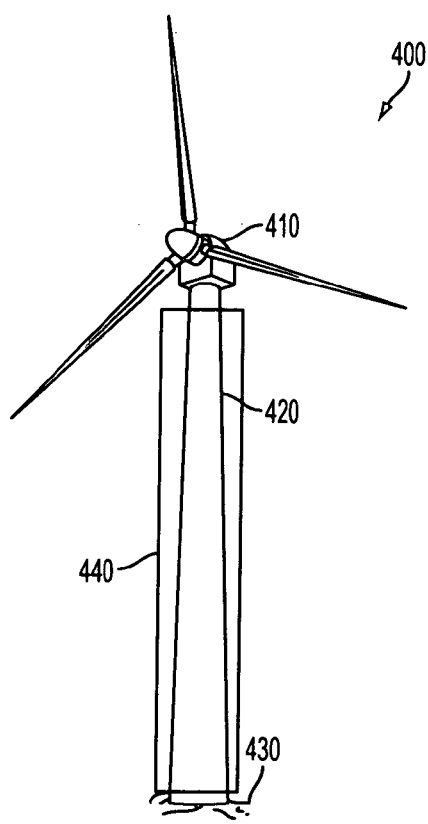
FIG. 4 is a cloak placed on a wind turbine.

According to an exemplary embodiment from a diagram 400 shown in FIG. 4, an electromagnetic signal noise caused by a wind turbine 410 can be reduced, particularly from its tower 420 that elevates the turbine 410 above the ground plane 430. Specifically, an annular cloak 440 can be used to obscure the stand 420, enabling electromagnetic waves to pass through as if the wind turbine 410 is absent. While shown on the tower 420 of the wind turbine 410, artisans of ordinary skill will understand that the cloak 440 could also be on the turbine blades, in elements of the nacelle, or other locations where electromagnetic interference need be reduced.

According to another exemplary embodiment from a diagram 500 in FIG. 5, exemplary embodiments can be used to reduce electromagnetic interference caused by struts on an aircraft 510 structurally reinforced by external struts 520. Electromagnetic interference caused by the struts 520 can be reduced by their concealment to electromagnetic radiation with cloaks 530. While shown on the struts 520, artisans of ordinary skill will understand that the cloak 530 could be used in other areas of the airplane 510, including internally such as within wing spares, internal doors, etc., as well as on other portions of the airframe such as leading edges of the wing.

FIG. 6 shows a diagram 600 for a dish antenna 610 with a horn 620 supported by struts 630 that are enveloped by cloaks 640 to reduce electromagnetic interference from the struts 630. While disposed around the struts 630, artisans of ordinary skill will understand that the cloaks 640 could also be used on a stand of the dish antenna 610 or any other portion where reduction of electromagnetic interference is desired.

According to an exemplary embodiment, as shown in FIG. 7, the metal lens is amenable to tunability. Tuning can be accomplished by placing an array 710 of tunable split-ring resonators 720 within each vane structure of a metal lens cloak such as metal patterns forming a metasurface printed on a flexible sheet, such as a plastic substrate. Each exemplary resonator 720 includes an outer split ring 730 and an inner split ring 740 with the separation of each ring opposite in orientation to absorb the electromagnetic energy from a wave at the tuned frequency. Such split ring resonators enable negative values of permittivity and permeability to be artificially produced, whereas such characteristics are not naturally found.

Metal lens cloak designs where each vane is made from four identical segments of plate material of constant radius and circumference: a) a cloak where vane separation is periodic at the narrowest points, and b) a cloak where vane separation is periodic at the inputs and outputs.

Various exemplary embodiments provide a one-dimensional electromagnetic cloak, meaning bending parallel electromagnetic waves from interference from an object along a single plane, being effectively along a line. The exemplary technique utilizes a metal lens to guide a plane wave of specific polarization and frequency around an object. The effective index-of-refraction requirement necessary to extinguish phase delay (0<n<1 for a cloak embedded in free space) is inherent in the nature of the waveguide.

A central advantage of this approach is that large scale objects can be cloaked due to the low-loss nature of the metal lens waveguide. Further, anisotropic techniques to guide a wave through a two-dimensional path around an object are not necessary. This concept offers simplicity in design and can lead to rapid fabrication time and reduced costs. Thus, this is appealing for select applications where the electromagnetic influence of objects along a view path can be removed or at least mitigated.

Various concepts have been proposed to establish electromagnetic cloaking. The method necessitated the flexibility intrinsic to metamaterials to fabricate a cloak, which was first demonstrated using a two-dimensional cylindrical approach. The radiation was restricted to a fixed polarization and frequency which allowed for a clever approximation to the cloak problem that greatly simplified fabrication.

Constraints to the problem are that the input and output apertures of each individual guide are constant and normal to the input and output face, and that each plate is formed of four identical constant radius segments. This latter constraint maximizes curvature enabling smoother impedance transitions through the guides. The dielectric material inside the guide can be the same as that outside the guide and assumed to be unity for the simulations. The electrical lengths are optimized to be a multiple of wavelength to minimize reflection. The smooth transition of the guides enables adiabatic energy to flow through the guide. Such a guide design enables production at very low cost and being very light weight.

Additional references regarding electromagnetic tuning can be obtained from K. A. Boulais et al., "Tunable split-ring resonator for metamaterials using photocapacitance of semi-insulating GaAs", *Appl. Phys. Lett.*, 93 (043518), 2008, or by other such methods. Tuning can also be mechanically provided by varying the plate separation using pressure (air, hydraulic, etc.), electromechanical (such as piezoelectric), magnetomechanical, thermoelectric, or other means. Thus, many techniques exist to tune the metal lens cloak so as to account for different electromagnetic radiation frequencies and/or to enhance cloaking within a desired spectrum.

According to an exemplary embodiment, the metal lens cloak can have a perfect impedance match by using principles of interference coatings. The vane structure of a metal lens represents a waveguide. In a practical device, the input of the waveguide alone can almost match free space. Any remaining reflection can be compensated for by using principles of destructive interference.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. An electromagnetic cloak to conceal an object in an electromagnetic field, said cloak comprising:
    a first waveguide enclosing the object, said first waveguide including first and second metal plates separated from each other by a first gap of a first distance with dielectric material to form a first path around the object, said second metal plate having a first larger curvature radius than said first metal plate; and
    a second waveguide enclosing the object, said second waveguide including third and fourth metal plates separated from each other by a second gap of a second distance with said dielectric material to form a second path around the object, said third metal plate having a second larger curvature radius than said fourth metal plate, wherein said first and third plates are joined at opposite ends to enclose the object, said first and second paths diverting electromagnetic energy away from the object in the electromagnetic field.

2. The cloak of claim 1, wherein said dielectric material has a low value.

3. The cloak of claim 2, wherein said dielectric material has a dielectric constant unequal to unity.

4. The cloak of claim 1, wherein the cloak is tunable by altering and increasing curvature radii for successive plates in said first and second waveguides.

5. The cloaking system of claim 4, wherein said first and second plates form a sheet of tunable metamaterial forming a metasurface.

6. The cloak of claim 5, wherein tuning is performed by altering said first distance between said first and second plates.

7. The cloak of claim 6, wherein varying said first distance is accomplished by one of a pressure mechanism, an electromechanical mechanism, a magnetomechanical mechanism, and a thermoelectric mechanism.

8. The cloak of claim 1, further comprising:
    a first horizontal support, attached to a first base of said first plate; and
    a second horizontal support, attached to a second base of said second plate.

9. The cloak of claim 1, wherein the cloak is used for both horizontal and vertical polarizations.

10. The cloak of claim 1, wherein said first plate further comprises an inner surface being an electric conductor.

11. The cloak of claim 1, wherein said plates comprise one of cooper, silver and gold.

12. The cloak of claim 1, wherein said first waveguide includes successive metal plates that extend beyond said second metal plate with increasing curvature radii therefrom.

13. The cloak of claim 1, wherein said second waveguide includes successive metal plates that extend beyond said fourth metal plate with increasing curvature radii therefrom.

14. The cloak of claim 1, wherein said first waveguide includes first successive metal plates that extend beyond said second metal plate with increasing curvature radii therefrom, and said second waveguide includes second successive metal plates that extend beyond said fourth metal plate with increasing curvature radii therefrom.

* * * * *